United States Patent
Tani

[19]

[11] Patent Number: 6,114,730

[45] Date of Patent: *Sep. 5, 2000

[54] SEMICONDUCTOR DEVICE AND ITS MANUFACTURING METHOD

[75] Inventor: Toshiyuki Tani, Hiji-machi, Japan

[73] Assignee: Texas Instruments Incorporated, Dallas, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 09/079,533

[22] Filed: May 15, 1998

[51] Int. Cl.[7] .......................... H01L 23/62; H01L 29/00; H01L 27/01

[52] U.S. Cl. .......................... 257/353; 257/354; 257/505; 257/513; 257/347; 257/520; 257/508; 257/554

[58] Field of Search ..................................... 257/353, 354, 257/505, 513, 347, 520, 508, 554

[56] References Cited

U.S. PATENT DOCUMENTS

| | | | |
|---|---|---|---|
| 4,571,819 | 2/1986 | Rogers et al. | 29/576 |
| 5,045,904 | 9/1991 | Kobayashi et al. | 357/23.6 |
| 5,400,277 | 3/1995 | Nowak | 365/154 |
| 5,859,466 | 1/1999 | Wada | 257/508 |

OTHER PUBLICATIONS

Masatada Horiuchi and Kiyonori Ohoyu, Electrical and Crystrographical Properties of Poly–Si Interlayered (Ψ:PSI) SOI Wafers, Reference 17, Central Research Laboratory, Hitachi Ltd., Japan, pp. 37–44.

H. D. Chiou and F. Secco d'Aragona, Gettering of Bonded SOI Layers and Microdefects In Bonded Wafers, Reference 10, Discrete and Materials Technology Group Motorola Inc., Phoenix, AZ., pp. 416–423.

*Primary Examiner*—David Hardy
*Assistant Examiner*—Jhihan B. Clark
*Attorney, Agent, or Firm*—Bret J. Petersen; Frederick J. Telecky, Jr.

[57] ABSTRACT

Prevents deterioration of the element characteristics of the gate voltage tolerance and the like which is caused by the metallic contaminants that are sealed in the element forming region at the time of applying a trench separator in a SOI substrate. Polysilicon 12 is formed on the side walls of the trench 5, and the metallic contaminants within the element forming region are collected in this polysilicon 12.

8 Claims, 7 Drawing Sheets

SEMICONDUCTOR DEVICE AND ITS MANUFACTURING METHOD

FIELD OF THE INVENTION

This invention relates to a semiconductor device and its manufacturing method wherein the separation between elements is conducted by means of a trench separator, for example, a device that is particularly suitable by applying a trench separator in an SOI (silicon on insulator or semiconductor on insulator).

BACKGROUND OF THE INVENTION

Because the field oxide film formed by means of the LOCOS method used in the past in the interelement separation of semiconductor devices such as an LSI has problems such as bird's beak, it is difficult to respond to the downsizing of the field regions accompanying the change to microscopic dimensions and high integration of the elements in recent years. Thus, even though the field region is reduced in size, as an element separating method that conducts the interelement separation with good reliability, the trench separator is being used. This trench separator is one wherein the interelement separation is conducted by imbedding an insulating film within a groove (trench) formed in the element separating region (field region) of the semiconductor element.

FIG. 16 shows a structure used in the past wherein a trench separator is applied to the substrate of the so-called SOI structure wherein the elements are formed in a silicon semiconductor layer provided on top of an insulating layer.

The substrate 1 has an SOI structure wherein the substrate main body section 2 and the substrate surface section 3 are mutually electrically separated and isolated by means of the silicon oxide layer 4. For this type of SOI substrate, the SIMOX substrate or the like is well known, wherein, after two monocrystalline silicon substrates are glued together with an oxide film membrane interposed, the glued substrate is made thin by grinding the substrate on the element forming surface side, and an embedded oxide membrane is formed by ion injection of oxygen at a prescribed position and depth of the monocrystalline silicon substrate.

As is illustrated, the groove (trench) 5 is formed in the element separating region of the substrate surface section 3, and a trench-like element separating structure is formed by means of the silicon oxide film 6 provided on the side walls of this groove 5 and the polycrystalline silicon 7 filled inside the groove 5 on the inner side of this silicon oxide film 6. The polycrystalline silicon 7 is provided by means of the CVD method under low pressure for the purpose of being uniformly filled within the groove 5. The entire inside groove 5 can also be filled by means of SiO$_2$ (nondoped, or the so-called BPSG or the like) which is doped with phosphorus (P)/boron (B) by means of the CVD method under low pressure.

An element, for example, a bipolar element, a MOS element, or a resistor element is formed in the element forming region surrounded by this trench-like element separating structure (in the figure, a MOS transistor is exemplified).

However, in the above-mentioned trench-like element separating structure used in the past, there are the following problems.

In particular, in the case of the SOI structure, because each element forming region of the substrate surface section 3 is separated like a floating island by means of the silicon oxide layer 4 and the silicon oxide film 6, there was the problem that there was no protection from the metallic contaminants and the like that intruded into each element forming region, and these metallic components caused the element characteristics to deteriorate. For example, the metallic contaminants intruded within the gate oxide film of the MOS transistor, and the voltage resistance of the gate oxide film decreased.

Thus, the purpose of this invention is to offer a semiconductor device and its manufacturing method having a trench-like element separating structure in which the metallic contaminants and the like that have intruded into each element forming region can be effectively collected, and the deterioration of the element characteristics due to these metallic contaminants can be reduced.

SUMMARY OF THE INVENTION

The semiconductor device of this invention that solves the above-mentioned problems is equipped with a semiconductor substrate, a groove provided in the surface region of the above-mentioned semiconductor substrate in the element separating region, a polycrystalline silicon layer provided on the side faces of the above-mentioned groove, and an insulating layer formed by filling the inside of the above-mentioned groove with the above-mentioned polycrystalline silicon layer interposed.

Also, the manufacturing method for a semiconductor device of this invention has a process that forms a groove in the region that becomes the element separating region of the semiconductor substrate, a process that forms a polycrystalline silicon film on the entire surface of the above-mentioned semiconductor substrate including the inside of the above-mentioned groove, a process that anisotropically etches the above-mentioned polycrystalline silicon film, and leaves the above-mentioned polycrystalline silicon film only on the side faces of the above-mentioned groove, a process that forms an insulating film on the entire surface of the above-mentioned semiconductor substrate including the inside of the above-mentioned groove in which the above-mentioned polycrystalline silicon film remains, and a process that forms the prescribed patterns including the above-mentioned insulating film and the region of the above-mentioned groove.

Figure 1:
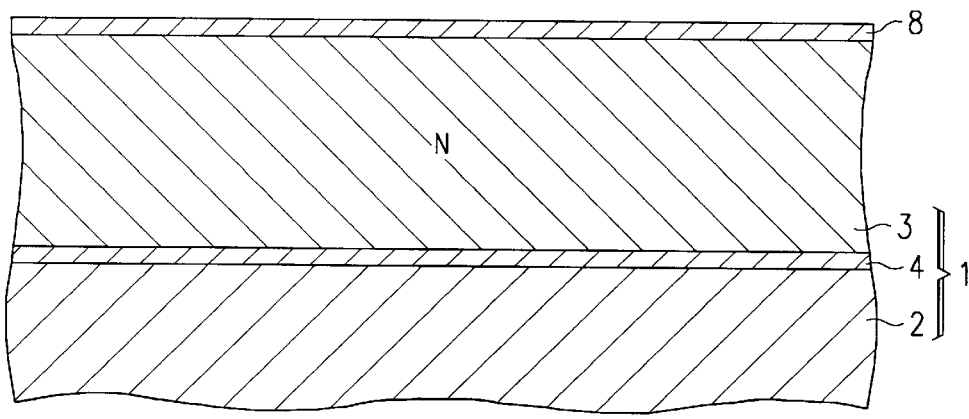
FIG. 1 is an outline cross-sectional view showing a manufacturing process for a semiconductor device according to Embodiment 1 of this invention.

REFERENCE NUMERALS AND SYMBOLS AS SHOWN IN THE DRAWINGS 1 represents a SOI substrate, 2 a substrate main body section, 3 a substrate surface section, 4 a silicon oxide layer, 5 a groove (trench), 7 a polycrystalline silicon, 8 a silicon oxide film, 12 a polycrystalline silicon film, 13 a silicon oxide film. 14 a photoresist, 18,21 an impurity diffusion layer, 19 a gate oxide film, 20 a gate electrode.

DESCRIPTION OF EMBODIMENTS

Below, this invention is explained according to preferred embodiments.

Embodiment 1

First, Embodiment 1, in which this invention is applied to the trench separation of an SOI substrate is explained according to its manufacturing method with reference to FIG. 1–8.

First, as shown in FIG. 1, the silicon oxide film 8 is formed by means of the CVD method on top of the substrate surface section 3 of the SOI substrate 1, wherein are provided the substrate surface section 3 made up of, optionally, monocrystalline semiconductor silicon, and a substrate main body section 2 made up of a monocrystalline semiconductor silicon, with the oxide silicon layer 4 interposed.

Figure 2:
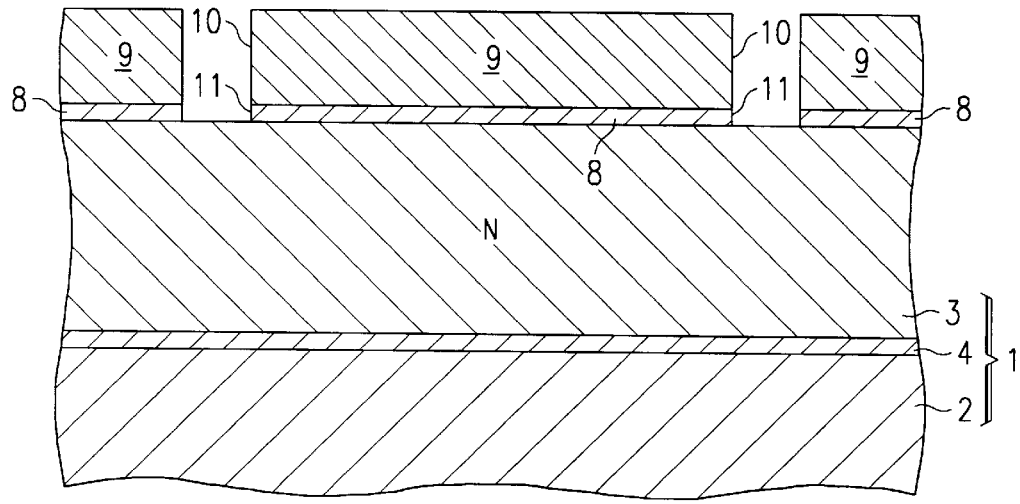
FIG. 2 is an outline cross-sectional view showing a manufacturing process for a semiconductor device according to Embodiment 1 of this invention.

Next, as shown in FIG. 2, the photoresist 9 is painted on the entire face, this photoresist 9 is patterned by means of photolithography, and the window 10 is formed at the prescribed position of the region that later is to become the element separating region (field region). After this is done, the silicon oxide film 8 is dry etched by using this photoresist 9 as an etching mask, and as is shown in the figure, the window 11 corresponding to the window 10 of the photoresist 9 is formed in the silicon oxide film 8.

Figure 3:
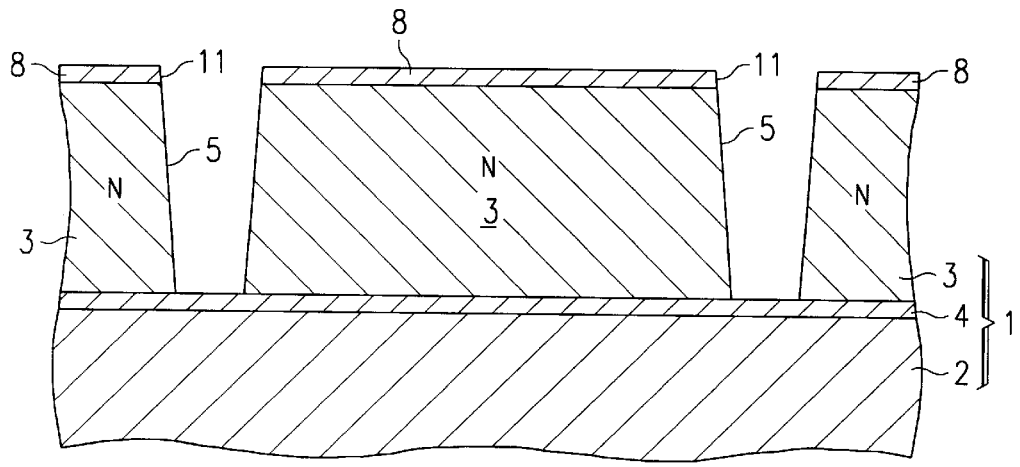
FIG. 3 is an outline cross-sectional view showing a manufacturing process for a semiconductor device according to Embodiment 1 of this invention.

Next, as shown in FIG. 3, after the photoresist 9 has been removed, this time, the substrate surface section 3 of the SOI substrate 1 is dry etched by using the silicon oxide film 8 as an etching mask, and groove 5 is formed in the substrate surface section 3. At this time, by using the silicon oxide layer 4 of the SOI substrate 1 as an etching stopper, as illustrated, the groove 5 can be formed to a depth that reaches the silicon oxide layer 4. Also, the film thickness of the silicon oxide film 8 is slightly reduced because of the etching at this time.

Figure 4:
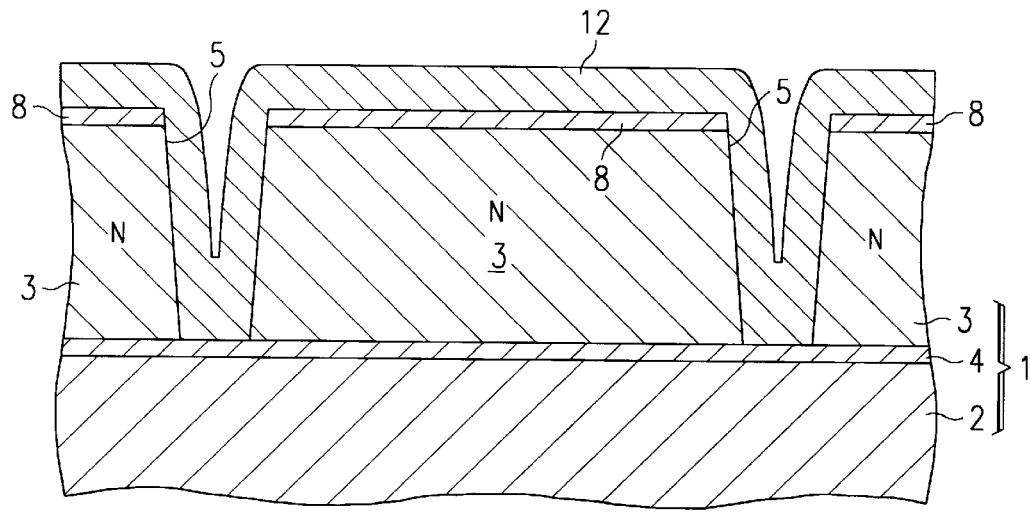
FIG. 4 is an outline cross-sectional view showing a manufacturing process for a semiconductor device according to Embodiment 1 of this invention.

Next, as shown in FIG. 4, the polycrystalline silicon film 12 is formed on the entire face including the groove 5, and phosphorus is introduced into this polycrystalline silicon film 12. This introduction of phosphorus can be conducted by means of the ion injection method after the forming of the polycrystalline silicon film 12. Or, that phosphorus can also be introduced at the same time as the forming of the polycrystalline silicon film by mixing phosphorus in the reaction gas at the time of forming the polycrystalline silicon film 12 by the CVD method.

Figure 5:
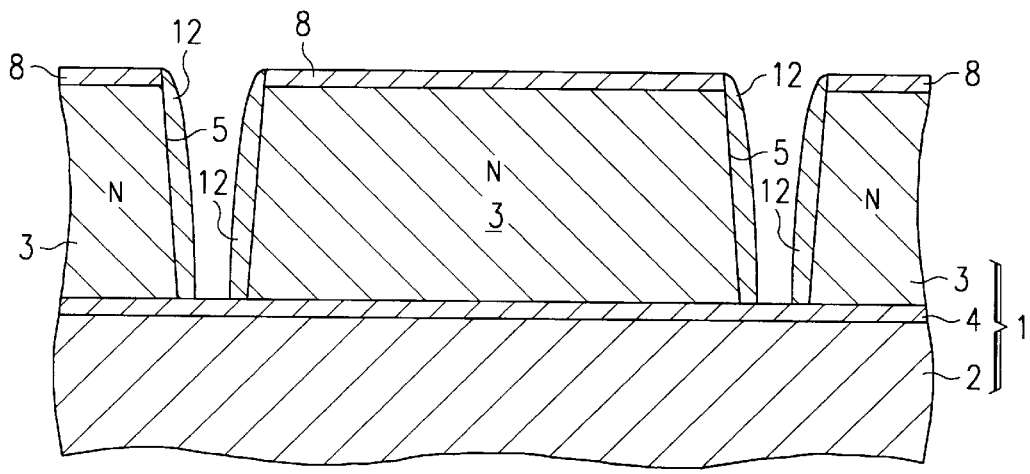
FIG. 5 is an outline cross-sectional view showing a manufacturing process for a semiconductor device according to Embodiment 1 of this invention.

Next, as is shown in FIG. 5, the polycrystalline silicon film 12 is etched by means of an anisotropic dry etching method such as RIE (reactive ion etching). As illustrated, the polycrystalline silicon film 12 remains only on the side faces of the groove 5. At this time, the film thickness of the polycrystalline silicon film 12 remaining on the inside faces of the groove 5, in contrast to the approximately 2 $\mu$m width of the groove 5, is made, for example, about 3000–6000 Å.

Figure 6:
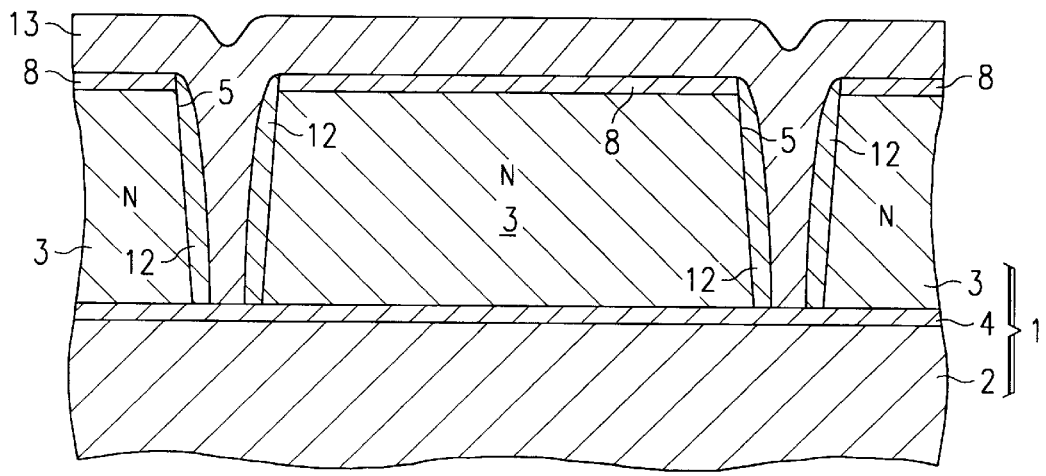
FIG. 6 is an outline cross-sectional view showing a manufacturing process for a semiconductor device according to Embodiment 1 of this invention.

Next, as shown in FIG. 6, the silicon oxide film 13 is formed on the entire face so as to fill the inside of the groove 5. From the point of the interelement separation and the oxide film voltage tolerance, it is preferable that the width of this silicon oxide film within the groove 5 be made greater than 8000 Å (in the above mentioned, it can be made 1 $\mu$m).

Figure 7:
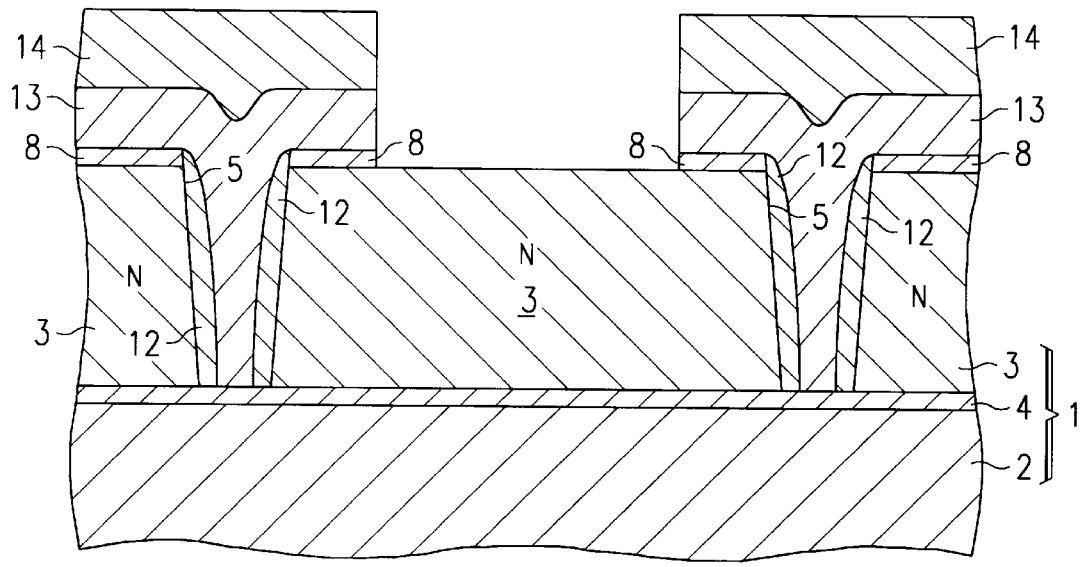
FIG. 7 is an outline cross-sectional view showing a manufacturing process for a semiconductor device according to Embodiment 1 of this invention.

Next, as shown in FIG. 7, the photoresist 14 formed on the entire face is etched by means of photolithography, and by using this photoresist 14 as an etching mask, the silicon oxide film 13 and the silicon oxide film 8 of the element forming region are removed. By this means, as shown in the figure, the silicon oxide film 13 and the silicon oxide film 8 remains only in the field region in which the groove 5 is provided. After this is done, the photoresist 14 is removed.

Figure 8:
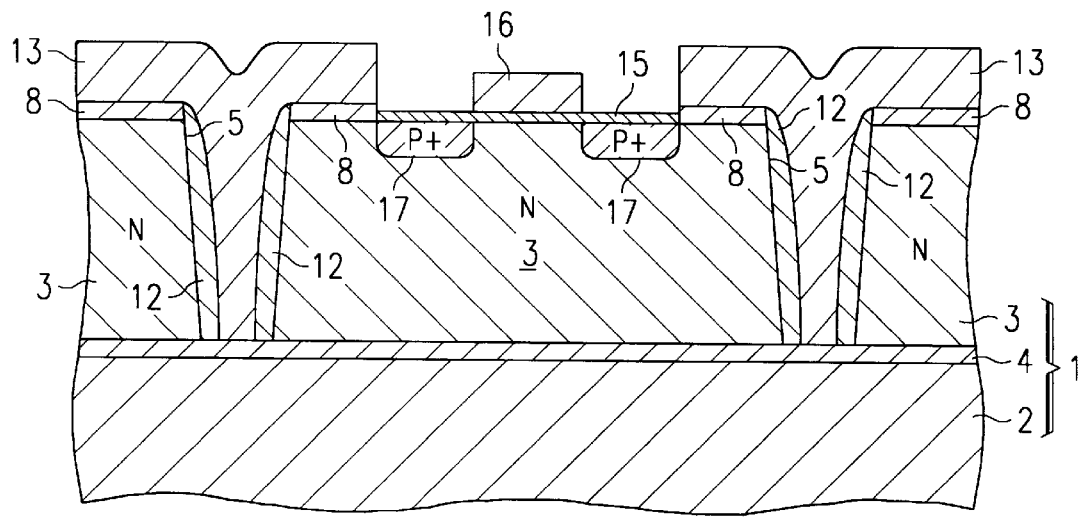
FIG. 8 is an outline cross-sectional view showing a manufacturing process for a semiconductor device according to Embodiment 1 of this invention.

Next, as shown in FIG. 8, the prescribed element structure is formed in the element forming region in which the silicon oxide film 13 and the silicon oxide film 8 have been formed. For example, the gate oxide film 15 is formed on top of the substrate surface section 3 of the SOI substrate 1, and the gate electrode 16 is formed to the prescribed pattern on top of that. After this is done, ion injection is conducted by using the silicon oxide film 13 and the silicon oxide film 8, as well as the gate electrodes 16, as a mask, and an impurity diffusion layer 17 of the prescribed conductor type is formed on the substrate surface section 3. By this means, a MOS transistor is formed in which the gate electrode 16 is made the gate, and the pair of impurity diffusion regions 17 [are made] the source/drain.

In this Embodiment 1, since the polycrystalline silicon film 12 is provided on the side faces of the groove 5 that constructs the trench separator, the metallic impurities and the like that intrude into the element forming region are collected in this polycrystalline silicon film 12. Therefore, the deterioration of the element characteristics that originates in these metallic impurities and the like is prevented.

In the above-mentioned Embodiment 1, phosphorus was introduced into the polycrystalline silicon film 12 provided on the side faces of the groove 5 (in other words, the dispersion of impurities from the polycrystalline silicon film 12 during element formation), but for the impurities that are introduced into this polysilicon film 12, by considering the material used for the purpose of collecting, the distance from the element to the groove 5, and the like, phosphorus or boron can be selected for the sake of convenience. A nondoped polycrystalline silicon film 12 can also be used.

Figure 16:
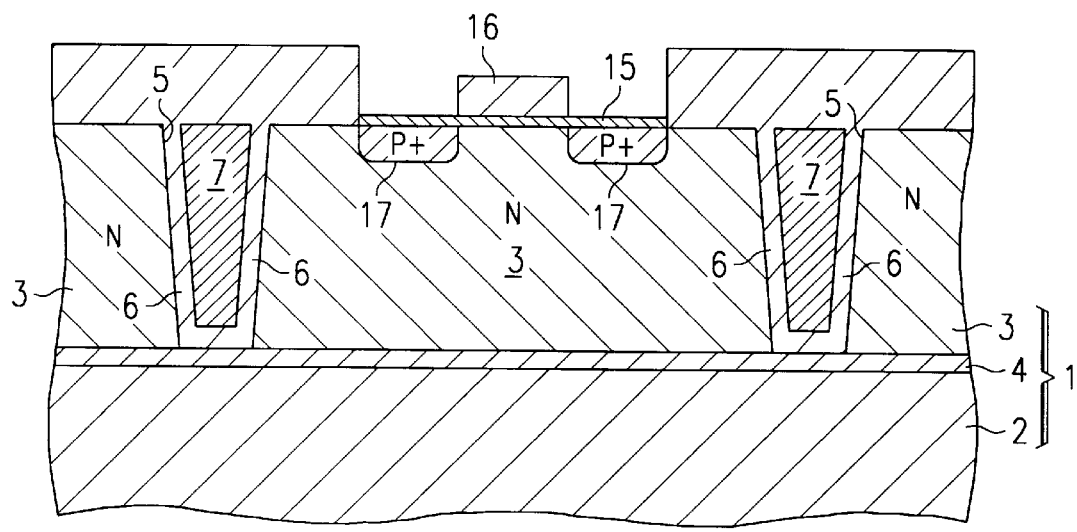
FIG. 16 is an outline cross-sectional view showing a semiconductor device used in the past.

In the following Table I, the results are shown in which the voltage tolerances are checked for a gate oxide film (film thickness about 500 Å) in a p-well and an n-well in a trench separating construction used in the past shown in FIG. 16 and a trench separating construction according to Embodiment 1 of this invention shown in FIG. 8. In the table, points 1-1 to 1-5 show the fact that measurements were made at 5 points on a single wafer, and [points] 2-1 to 2-5 show the fact that the measurements were made at 5 points for a separate wafer.

TABLE I

|  | Used in the past | | Present invention | |
| --- | --- | --- | --- | --- |
| Point | p-well | n-well | p-well | n-well |
| 1-1 | 29.5 | 24 | 35 | 51 |
| 1-2 | 29.5 | 0.5 | 39 | 53 |
| 1-3 | 32.5 | 23 | 21 | 51 |
| 1-4 | 33 | 0 | 32 | 52 |
| 1-5 | 31.5 | 30 | 34 | 51 |
| 2-1 | 27.5 | 26 | 33 | 50 |
| 2-2 | 28 | 24 | 38 | 50 |
| 2-3 | 28.5 | 24.5 | 37 | 48 |
| 2-4 | 29.5 | 0 | 35 | 41 |
| 2-5 | 33 | 13 | 21 | 48 |
| Average | 30.3 | 16.5 | 32.5 | 49.5 |
| Reference error | 2.08 | 12.04 | 6.43 | 3.37 |

Gate oxide film voltage tolerance (V)

From the results of this Table I, it can be seen that by means of using the trench separation construction according to the Embodiment 1 of this invention, the gate oxide film voltage tolerance can be greatly increased. From this fact, it is thought that the polycrystalline silicon film 12 provided on the side faces of the trench separating construction according to the Embodiment 1 of this invention effectively collects the metallic impurities and the like that caused the deterioration of the voltage tolerance by intruding into the gate oxide film used in the past.

In the following Table II, the results are shown in which the gate voltage tolerance of a high voltage NMOS transistor and PMOS transistor that were actually manufactured were checked. In the table, for the PMOS, the gate voltage of those in which 32 high voltage PMOS transistors were aligned in a chip, and for the NMOS, the gate voltage tolerance of those in which 16 high voltage NMOS transistors were aligned within a chip, are respectively shown.

TABLE II

| Used in the past | | Present invention | |
| --- | --- | --- | --- |
| NMOS | PMOS | NMOS | PMOS |
| 24 | 47 | 35 | 47 |
| 23 | 47 | 38 | 45 |
| 24 | 47 | 35 | 46 |
| 25 | 47 | 39 | 46 |
| 24 | 46 | 37 | 46 |
| 26 | 46 | 38 | 48 |

Voltage tolerance (V)

From the results of this Table II, it can be seen that the gate voltage tolerance is increased, particularly in a high voltage NMOS transistor, by means of using the trench separating construction according to the Embodiment 1 of this invention.

Figure 9A:
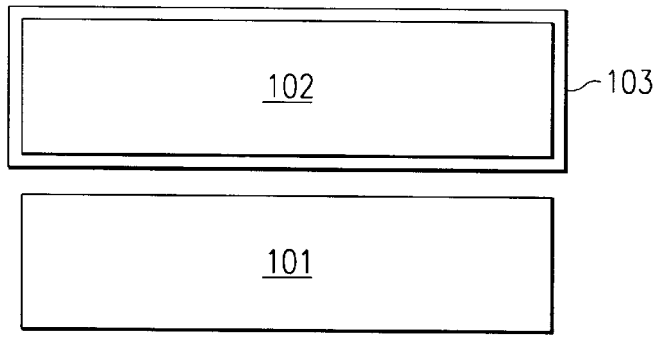
FIG. 9 is an outline cross-sectional view showing one example of a manufacturing method for a SOI substrate.
Figure 9B:
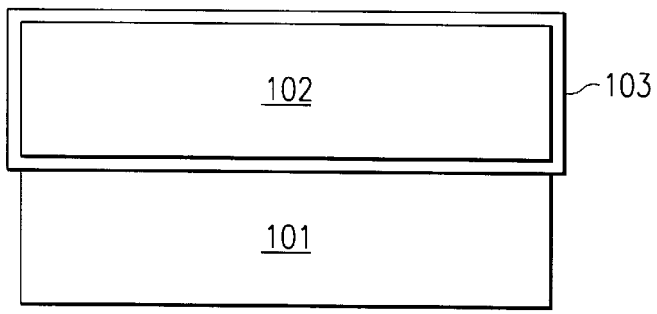
Figure 10A:
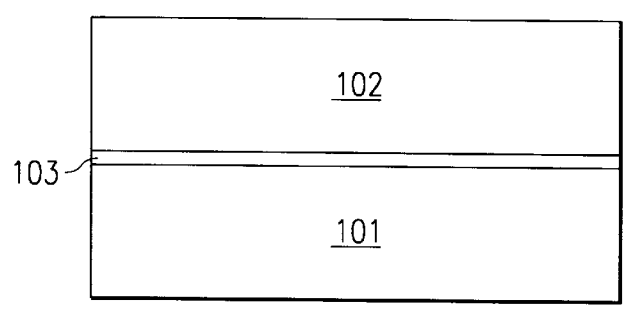
FIG. 10 is an outline cross-sectional view showing one example of a manufacturing method for a SOI substrate.
Figure 10B:
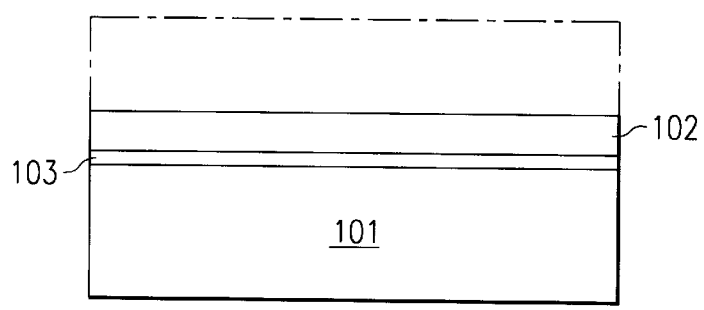

One example of a manufacturing method for an SOI substrate that is obtained by using the above-mentioned Embodiment 1 is shown in FIG. 9 and FIG. 10.

First, as is shown in FIG. 9(*a*), the monocrystalline silicon 101 and the monocrystalline silicon substrate 102, wherein the oxide film 103 is formed on the surface, are glued together, as shown in FIG. 9(*b*).

Next, as is shown in FIG. 10(*a*), the silicon oxide film 103 is removed by means of etching for sections other than the contact surface of the silicon substrate 102. After this is done, as shown in FIG. 10(*b*), the silicon substrate 102 is ground until the prescribed thickness (for example, about 9 μm).

By this means, an SOI substrate is formed in which the silicon substrate 101 is made the substrate main body section, silicon substrate 102 [is made] the substrate surface section.

Now then, as an SOI substrate, besides the glued substrate such as mentioned above, a SIMOX substrate or the like can also be used.

Embodiment 2

Figure 11:
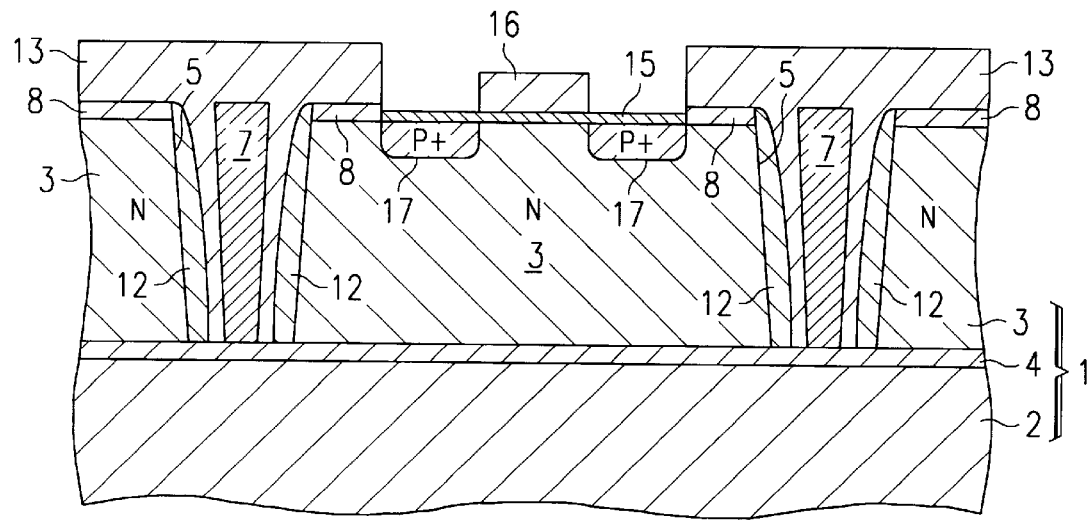
FIG. 11 is an outline cross-sectional view showing a semiconductor device according to Embodiment 2 of this invention.

A trench separating construction according to Embodiment 2 of this invention is shown in FIG. 11.

In this Embodiment 2, as shown in the figure, the polycrystalline silicon 7 is also embedded on the inner side of the silicon oxide film 13 embedded within groove 5. Therefore, by means of this silicon oxide film 13 and the polycrystalline silicon 7, an element separating function is achieved in the same manner as in the past that was explained by FIG. 16. In this Embodiment 2, since the polycrystalline silicon film 12 provided on the inside faces of the groove 5 shows a collecting action for the element forming region, the deterioration of the element characteristics due to metallic contaminants and the like that intrude into the element forming region is prevented.

This Embodiment 2, except for the construction mentioned above, is the same as the previously presented Embodiment 1. Therefore, the same keys as in the previously presented Embodiment 1 are applied to the components corresponding to those in the previously presented Embodiment 1, and their detailed explanation is omitted [here].

Embodiment 3

Next, Embodiment 3 of this invention is explained with reference to FIGS. 12–15.

Figure 12:
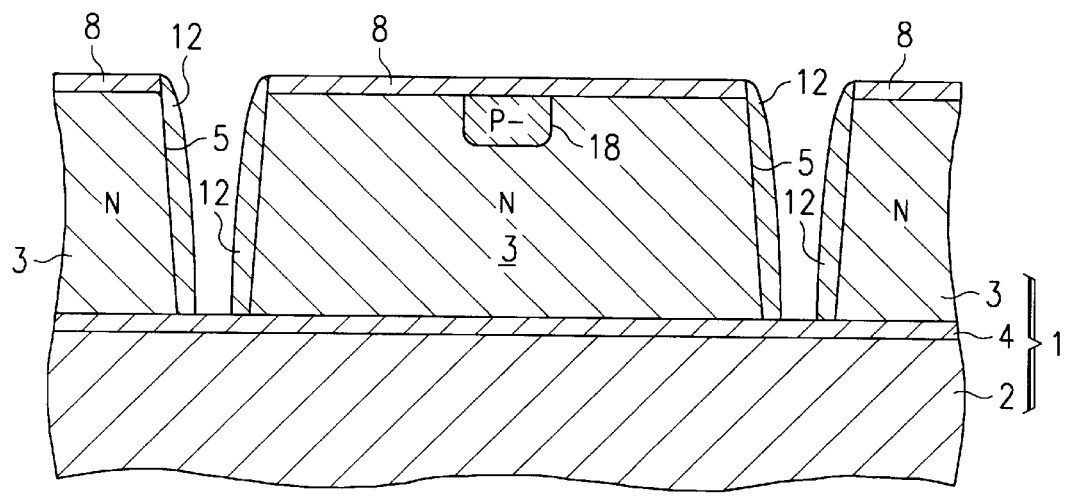
FIG. 12 is an outline cross-sectional view showing a manufacturing process for a semiconductor device according to Embodiment 3 of this invention.

In this Embodiment 3, before the process of FIG. 1 of the previously presented Embodiment 1, as shown in FIG. 12, the drain region 18 of the MOS transistor is formed. At this time, in the case of forming the p-type drain region 18 in the n-type substrate surface section 3, the diffusion of boron (B) is conducted. Also, in the case of forming an n-type drain region in a p-type substrate surface section, the fusion of phosphorus (P) is conducted.

Figure 13:
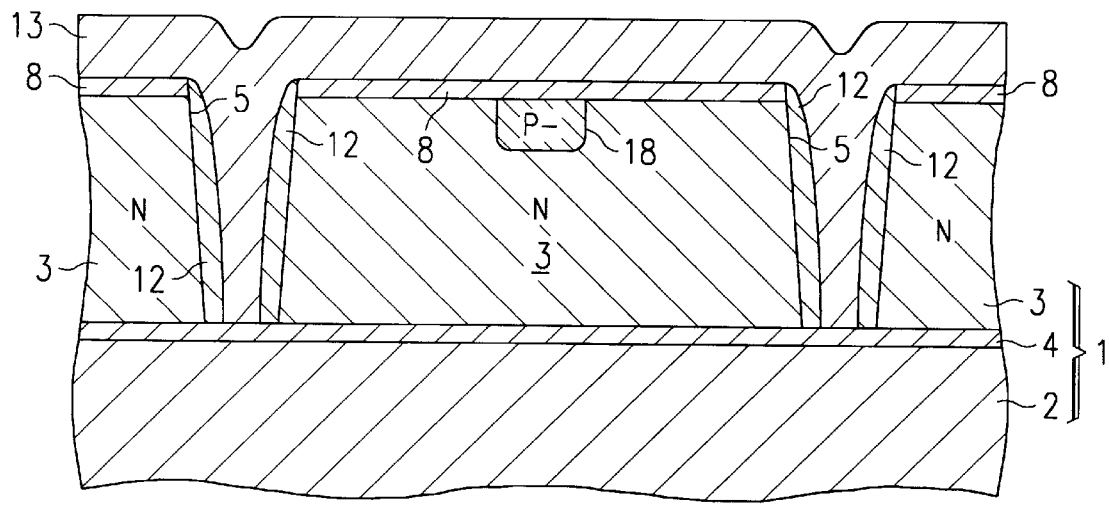
FIG. 13 is an outline cross-sectional view showing a manufacturing process for a semiconductor device according to Embodiment 3 of this invention.

Next, as shown in FIG. 13, the silicon oxide film 13 is formed on the entire surface so as to fill in the groove 5.

Figure 14:
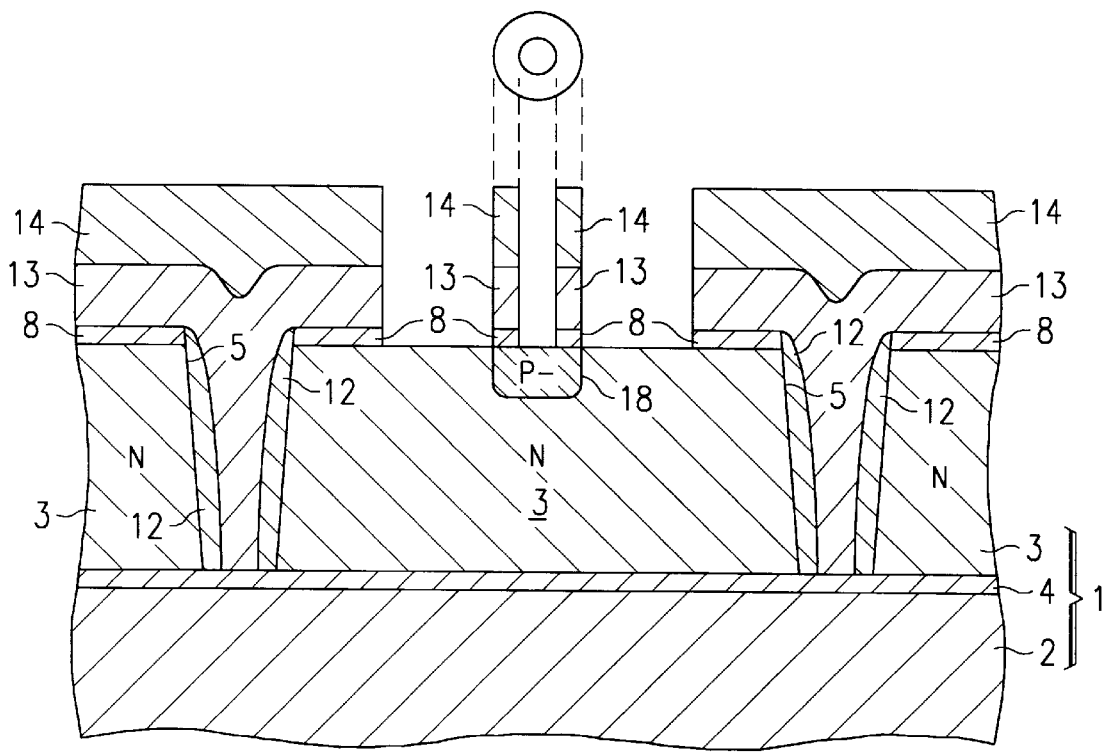
FIG. 14 is an outline cross-sectional view showing a manufacturing process for a semiconductor device according to Embodiment 3 of this invention.

Next, as shown in FIG. 14, patterning of the silicon oxide film 13 and the silicon oxide film 8 is conducted by using the photoresist 14, as shown in FIG. 14, but in this Embodiment 3, as illustrated, the silicon oxide film 13 remains in a pattern so as to surround the previously formed impurity diffusion layer 18.

Figure 15:
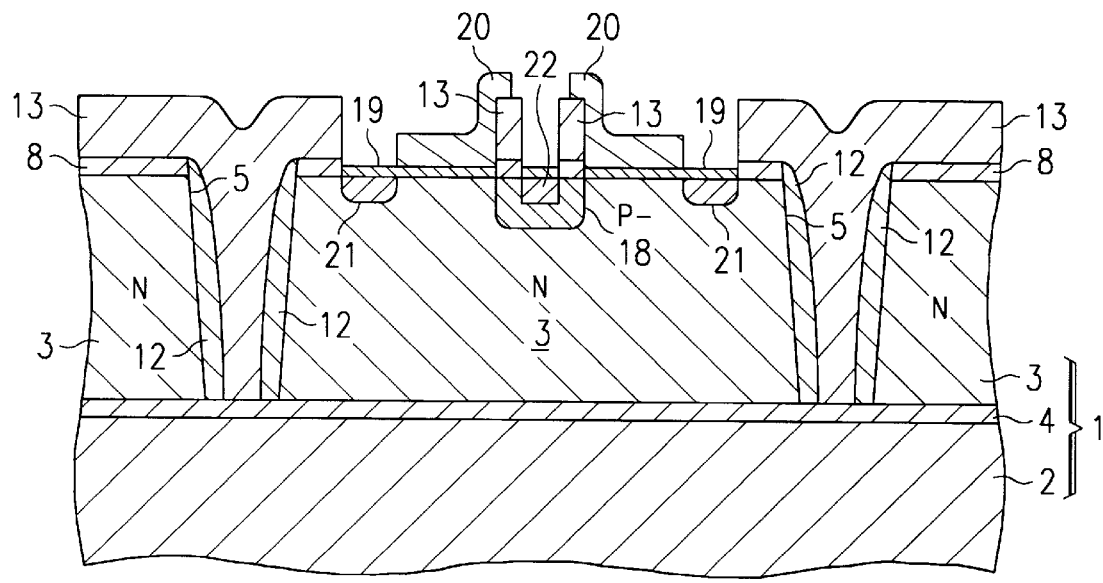
FIG. 15 is an outline cross-sectional view showing a manufacturing process for a semiconductor device according to Embodiment 3 of this invention.

Next, as is shown in FIG. 15, after the photoresist 14 is removed, gate oxide film 19 is formed in the element forming region, and the gate electrode 20 is formed in the prescribed pattern on top of that. After this is done, ion injection is conducted using the silicon oxide film 13 as a mask and the silicon oxide films 8 of the field region, as well as the gate electrode 20, and the impurity diffusion layer 21 that becomes the source region and the impurity diffusion layer 22 that becomes the drain region of the MOS transistor in the substrate surface section are respectively formed on substrate surface 3. By this means, as shown in the FIG., a MOS transistor of a high voltage tolerance construction (about 250 V) wherein the drain region is covered by a silicon oxide film 13 of a film that is thicker (about 10,000–12,000 Å) than the gate oxide film (about 500 Å).

In this Embodiment 3, since the silicon oxide film 13 that fills the groove 5 is also used as an oxide film of a film thickness that surrounds the drain region of a high voltage MOS structure, its construction is simple.

Above, explanations were given according to preferred embodiments of this invention, but this invention is not limited to the above-mentioned embodiment.

For example, the trench-like element separating structure of this invention is also particularly effective applied to the case of a SOI substrate, but it is not necessarily limited to this, and it is also one that is effective even when applied to the interelement separation of an ordinary monocrystalline silicon substract.

In this invention, a polycrystalline silicon layer is provided on the side faces of a groove provided for the purpose of interelement separation, and is made so that the metallic inpurities and the like that intrude into the element forming region are collected in this polycrystalline silicon layer. Therefore, deterioration of the element characteristics because of these metallic impurities is prevented, and a semiconductor device with a high reliability can be offered.

What is claimed is:

1. A semiconductor device comprising:

a semiconductor substrate main body section, an insulating film on the substrate main body section;

a substrate surface layer over the insulating film;

a groove formed in the surface layer of the in an element separating region, a polycrystalline silicon layer formed directly on the side faces of the above-mentioned groove, and an insulating layer formed embedded within the above-mentioned groove with the above-mentioned polycrystalline silicon layer interposed.

2. A semiconductor device recorded in claims 1, wherein the above-mentioned polycrystalline silicon layer contains phosphorus or boron.

3. A semiconductor device recorded in claim 1, wherein the above-mentioned groove is provided at a depth that passes through the above-mentioned surface region of the above-mentioned semiconductor substrate, and reaches the above-mentioned second insulating layer.

4. A semiconductor device reported in claims 3, wherein, on the inside of the above-mentioned insulating layer formed embedded within the above-mentioned group, a second polycrystalline silicon layer is provided in which its periphery is surrounded by said insulating layer.

5. A semiconductor device recorded in claims 3, wherein the above-mentioned polycrystalline silicon layer contains phosphorus or boron.

6. A semiconductor device recorded in claim 4, wherein the above-mentioned polycrystalline silicon layer contains phosphorus or boron.

7. A semiconductor device recorded in claims 6, wherein a MOS transistor is formed in an element forming region surrounded by means of the above-mentioned element separating region of the above-mentioned semiconductor substrate.

8. A semiconductor device recorded in claim 7, wherein the drain diffusion layer of the above-mentioned MOS transistor is formed within the above-mentioned substrate beneath the above-mentioned insulating layer having a film thickness less than the gate insulating film of the above-mentioned MOS transistor.

\* \* \* \* \*